(12) United States Patent
Yang et al.

(10) Patent No.: US 11,961,772 B2
(45) Date of Patent: Apr. 16, 2024

(54) METHOD AND APPARATUS FOR AUTOMATICALLY PROCESSING WAFERS

(71) Applicant: CHANGXIN MEMORY TECHNOLOGIES, INC., Hefei (CN)

(72) Inventors: Peng Yang, Hefei (CN); Biao Gao, Hefei (CN); Li-Wei Wu, Hefei (CN); Wen-Yi Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 393 days.

(21) Appl. No.: 17/601,732

(22) PCT Filed: Jun. 24, 2021

(86) PCT No.: PCT/CN2021/101960
§ 371 (c)(1),
(2) Date: Oct. 6, 2021

(87) PCT Pub. No.: WO2022/179011
PCT Pub. Date: Sep. 1, 2022

(65) Prior Publication Data
US 2023/0197535 A1    Jun. 22, 2023

(30) Foreign Application Priority Data
Feb. 25, 2021   (CN) .......................... 202110210103.0

(51) Int. Cl.
*H01L 21/66* (2006.01)
*G05B 19/418* (2006.01)
*G06T 7/00* (2017.01)

(52) U.S. Cl.
CPC ........ *H01L 22/20* (2013.01); *G05B 19/41875* (2013.01); *G06T 7/0004* (2013.01);
(Continued)

(58) Field of Classification Search
CPC ... H01L 22/20; H01L 22/12; H01L 21/67259; G05B 19/41875; G05B 2219/37224;
(Continued)

(56) References Cited

U.S. PATENT DOCUMENTS 7,257,459 B1 *   8/2007   Qu ................... G05B 19/41865
                                                        700/121
9,235,413 B1 *   1/2016   MacDonald ........... G05B 23/02
(Continued)

FOREIGN PATENT DOCUMENTS

CN   101197301 A   6/2008
CN   103972052 A   8/2014
(Continued)

OTHER PUBLICATIONS

"Michael B. Korzensk et al., Wafer Reclaim, Dec. 20, 2010, Wiley, p. 1, https://onlinelibrary.wiley.com/doi/abs/10.1002/9781118071748.ch13" (Year: 2010).*

(Continued)

*Primary Examiner* — Santosh R Poudel
(74) *Attorney, Agent, or Firm* — Ladas & Parry LLP

(57) ABSTRACT

The present application relates to the field of semiconductor manufacturing technologies, and in particular to a method and an apparatus for automatically processing wafers. The method for automatically processing the wafers includes the following steps: providing several wafers, wherein the wafers operate on a primary path, and the primary path is a path for forming semiconductor structures on the surfaces of the wafers; determining whether there is a need for detecting defects of the wafers, and if yes, automatically switching an operating path of the wafers to a secondary path; detecting the defects of the wafers in the secondary path; and determining whether the defect detection on the wafers is finished, and if yes, automatically switching the operating path (Continued)

of the wafers to the primary path. The application makes it possible to automatically detect the defects of the wafers with different SWR conditions, thereby improving the automation degree of machines.

8 Claims, 2 Drawing Sheets

(52) U.S. Cl.
CPC .... *H01L 22/12* (2013.01); *G05B 2219/37224* (2013.01); *G06T 2207/30148* (2013.01)

(58) Field of Classification Search
CPC ........ G05B 2219/45031; G06T 7/0004; G06T 2207/30148; Y02P 90/02
See application file for complete search history.

(56) References Cited

U.S. PATENT DOCUMENTS

| | | | |
|---|---|---|---|
| 2001/0011706 A1 | 8/2001 | Nara et al. | |
| 2005/0080572 A1* | 4/2005 | Lin | G05B 19/41875 702/35 |
| 2006/0178767 A1* | 8/2006 | Lee | G05B 19/41875 700/109 |
| 2009/0304261 A1 | 12/2009 | Takahashi et al. | |
| 2011/0280470 A1 | 11/2011 | Hayashi | |
| 2018/0366357 A1* | 12/2018 | Liao | G06T 7/0008 |

FOREIGN PATENT DOCUMENTS

| | | |
|---|---|---|
| CN | 203774269 U | 8/2014 |
| CN | 104699025 A | 6/2015 |
| CN | 107833843 A | 3/2018 |
| CN | 109427609 A | 3/2019 |
| CN | 110581082 A | 12/2019 |
| CN | 110676191 A | 1/2020 |
| CN | 110955863 A | 4/2020 |
| CN | 111554601 A | 8/2020 |
| CN | 112185830 A | 1/2021 |
| CN | 112185831 A | 1/2021 |
| JP | 2011237302 A | 11/2011 |
| TW | 200416919 A | 9/2004 |

OTHER PUBLICATIONS

ISR and written opinion for International Application PCT/CN2021/101960, dated Mar. 31, 2021, 8 pages.
Office Action and Search Report issued in the corresponding Chinese application No. 202110210103.0, dated May 9, 2022, 8 pages.
Notice of Allowance of the Chinese application No. 202110210103.0, dated Sep. 5, 2022.

* cited by examiner

METHOD AND APPARATUS FOR AUTOMATICALLY PROCESSING WAFERS

CROSS-REFERENCE TO RELATED APPLICATIONS

This application is a national phase entry of International Patent Application No. PCT/CN2021/101960, filed on Jun. 24, 2021, which claims priority to Chinese Patent Application No. 202110210103.0, filed on Feb. 25, 2021. The aforementioned patent applications are incorporated herein by reference in their entirety.

TECHNICAL FIELD

The present disclosure relates to the field of semiconductor manufacturing technologies, and in particular to a method and an apparatus for automatically processing wafers.

BACKGROUND

With continuous improvement in the precision of a semiconductor process, the semiconductor manufacturing factory has much higher requirements to fully-automated production. Particularly, for process steps with high precision, the engineer hopes to realize the fully-automated production, in order to reduce man-made operation errors. In a process for manufacturing semiconductor structures, since there are relatively many manufacturing procedures, after a certain procedures are completed, there is a need for performing corresponding detections to determine the wafer processing quality and provide the reference for the improvement in the wafer processing procedure. Meanwhile, in order to increase the productivity of the machine or reduce wafer manufacturing defects, it is often necessary to perform a SWR (Special Work Request) on wafers. However, a review tool in an existing wafer processing machine is incapable of automatically detecting wafers with different SWR conditions simultaneously. When there is a need for detecting wafers with different SWR conditions, it is only possible to perform offline operation, which greatly reduces the efficiency of the machine and increases the risk of manual operations.

Accordingly, how to improve the automation degree of an apparatus for processing wafers, automatically detect the defects of the wafers with different SWR conditions and improve the efficiency of the machine are technical problems to be solved urgently.

SUMMARY

The present disclosure provides a method and an apparatus for automatically processing wafers to solve the problem of low automation degree of an existing apparatus for processing wafers, such that the defects of the wafers with different SWR conditions may be automatically detected. Accordingly, the efficiency of the machine is improved and the risk of offline operations by an operator is reduced.

In order to solve the above problems, the present disclosure provides a method for automatically processing wafers. The method includes the following steps:
  providing several wafers, wherein the wafers operate on a primary path, and the primary path is a path for forming semiconductor structures on the surfaces of the wafers;
  determining whether there is a need for detecting defects of the wafers, and if yes, automatically switching an operating path of the wafers to a secondary path;
  detecting the defects of the wafers in the secondary path;
  determining whether the defect detection on the wafers is finished or not, and if yes, automatically switching the operating path of the wafers to the primary path.

In order to solve the above problems, the prevent disclosure further provides an apparatus for automatically processing wafers. The apparatus includes:
  a controlling module, which is configured to control several wafers to operate on a primary path, and the primary path is a path for forming semiconductor structures on the surfaces of the wafers;
  a determining module, which is configured to determine whether there is a need for detecting defects of the wafers, and if yes, automatically switch an operating path of the wafers to a secondary path;
  a detecting module, which is connected with the determining module and configured to detect the defects of the wafers in the secondary path;
  a processing module, which is connected with the detecting module and configured to determine whether the defect detection on the wafers is finished or not, and if yes, automatically switch the operating path of the wafers to the primary path.

According to the method and the apparatus for automatically processing the wafer according to the present disclosure, the operating path of the wafers may be automatically switched from the primary path to the secondary path; and after the wafers are detected on the secondary path, the operating path of the wafers is automatically switched from the secondary path to the primary path, such that the defects of the wafers with different SWR conditions may be automatically detected, and the automation degree of the machine is improved. Moreover, due to the fully-automated switching operation, risks and subjective errors of manual operation are reduced, and the shipping efficiency of the machine is increased accordingly. Moreover, the present disclosure may detect the defects at any step according to actual needs, which greatly reduces the impact on the product quality and lays the foundation for improving the product quality.

DESCRIPTION OF EMBODIMENTS

Detailed description of a method and an apparatus for automatically processing wafers according to the present disclosure will be described in detail below with reference to accompanying drawings.

Figure 1:
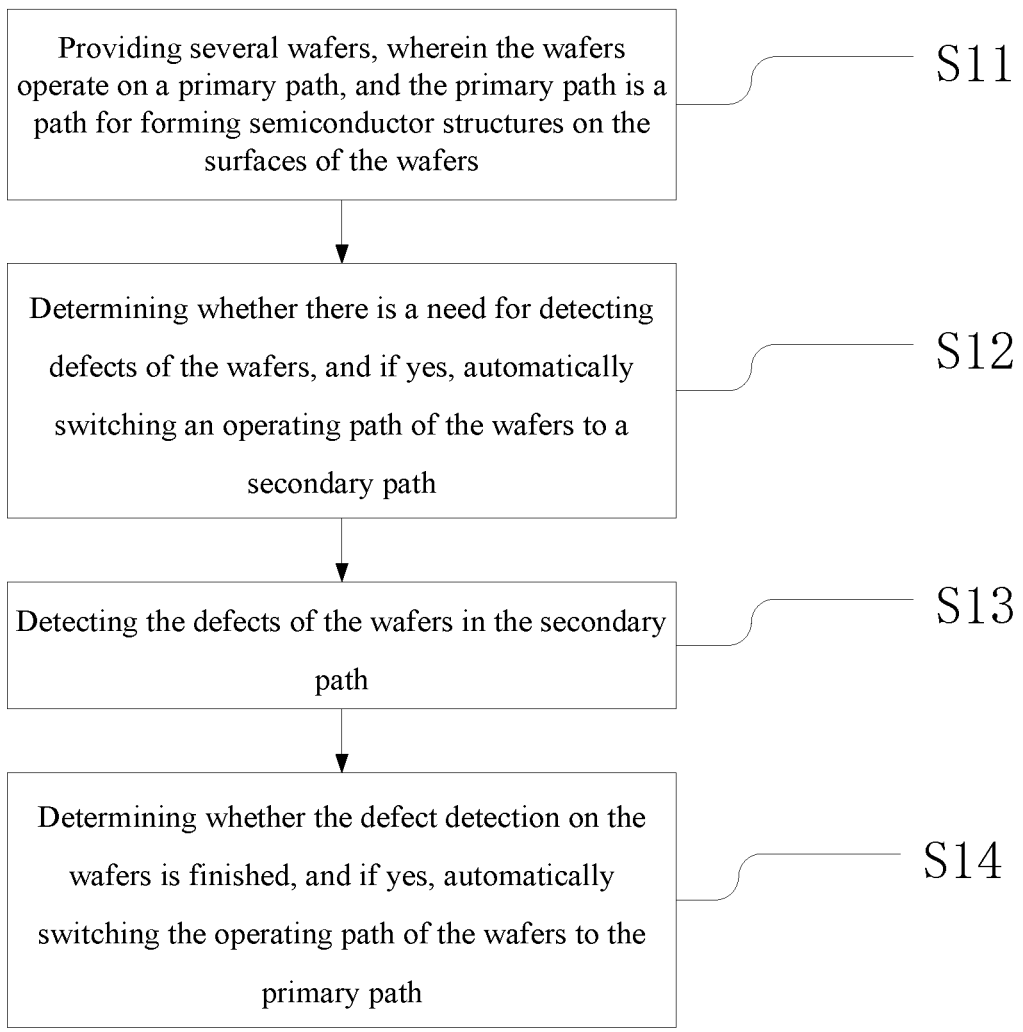
FIG. 1 is a flowchart of a method for automatically processing wafers according to a specific embodiment of the present disclosure.
Figure 2:
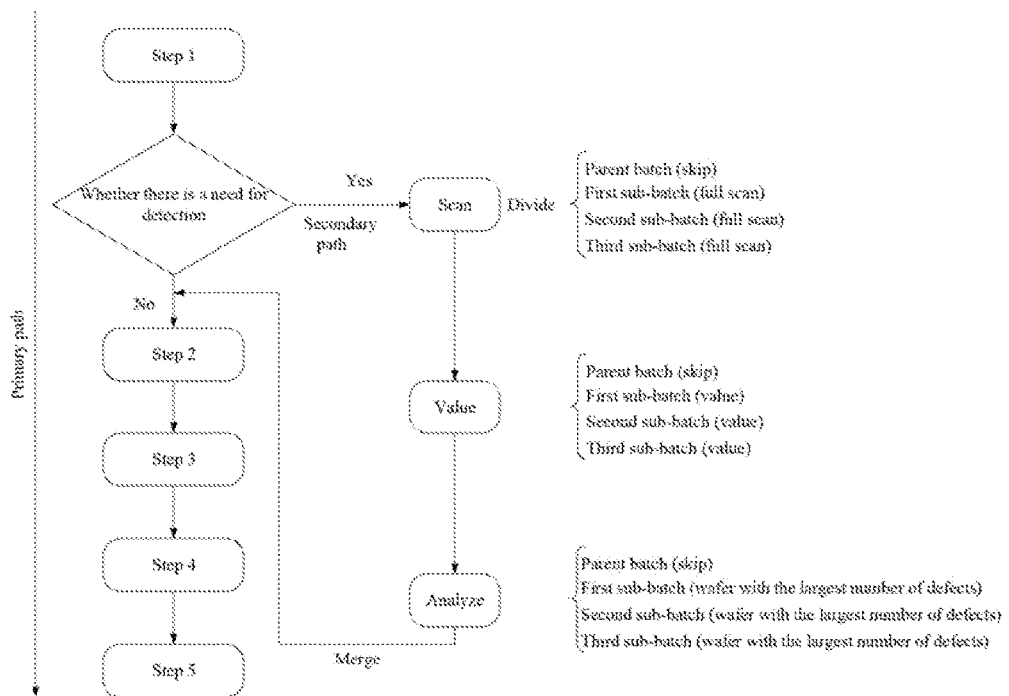
FIG. 2 is a schematic diagram when one batch of wafers is automatically processed according to a specific embodiment of the present disclosure.

A specific embodiment provides a method for automatically processing wafers. FIG. 1 is a flowchart of a method for automatically processing wafers according to a specific embodiment of the present disclosure, and FIG. 2 is a schematic diagram when one batch of wafers is automatically processed according to a specific embodiment of the present disclosure. As shown in FIG. 1 and FIG. 2, the method for automatically processing wafers according to this embodiment includes the following steps.

In step S11, several wafers are provided, wherein the wafers operate on a primary path, and the primary path is a path for forming semiconductor structures on the surfaces of the wafers.

Particularly, the primary path is a normal operating path on which the wafers operate, which is set for forming semiconductor products (that is, forming desired semiconductor structures on the surfaces of the wafers) in a semiconductor manufacturing process. For example, the path jointly formed by the step 1, the step 2, the step 3, the step 4 and the step 5 is the primary path of the wafers. After the wafers operate on the primary path, that is, the wafers are processed in the step 1, the step 2, the step 3, the step 4, and the step 5, the desired semiconductor structures may be formed on the surfaces of the wafers or the wafers may be obtained.

In step S12, it is determined whether there is a need for detecting defects of the wafers, and if yes, an operating path of the wafers is automatically switched to a secondary path.

Optionally, there is a plurality of processing steps in the primary path; the specific step of determining whether there is a need for detecting defects of the wafers includes:
  after the wafers are subjected to current processing steps, determining whether there is a need for detecting defects of the wafers.

Particularly, after the wafers operate on the primary path for a period of time, or after the wafers are processed to some extent on the primary path (for example, after the wafers are processed in the step 1), it is determined whether there is a need for detecting the wafers or not. If it is determined that there is a need for detecting the wafers, the machine automatically switches the operating path of the wafers from the primary path to the secondary path. If it is determined that there is no need for detecting the wafers, the machine controls the wafers to operate on the primary path and executes the next processing step (for example, the wafers continue to be processed in the step 2).

In this specific embodiment, a determining step may be set after each step on the primary path ends, so as to determine whether there is a need for detecting the defects after this step ends. Alternatively, a determining step may be set after multiple steps on the primary path end. Those skilled in the art may make a choice on the above according to actual manufacturing process requirements. The term plurality mentioned in this specific embodiment refers to two or more than two.

In step S13, the defects of the wafers are detected in the secondary path.

Optionally, the specific step of detecting the defects of the wafers in the secondary path includes:
  scanning the defects of the wafers;
  acquiring a wafer defect pattern after the defects are scanned; and
  analyzing the wafer defect pattern to acquire relevant information about the defects of the wafers.

Optionally, several wafers belong to the same batch of wafers; and before the defects of the wafers are scanned, the method further includes the following steps:
  dividing the wafers in the same batch into several sub-batches and one parent batch according to special processing conditions of the wafers on the primary path, wherein each of the sub-batches includes several wafers extracted from a plurality of wafers subjected to the same special processing condition, and the parent batch is composed of wafers except for the wafers forming all the sub-batches in the same batch.

Optionally, the specific step of detecting the defects of the wafers in the secondary path includes:
  scanning the defects of all the wafers in each of the sub-batches;
  acquiring a sub-batch defect scanning pattern of each of the sub-batches; and
  analyzing each of the sub-batch defect patterns to acquire defect-related information of each of the sub-batches.

Particularly, the wafers in the same batch include multiple sets of wafers, and the SWR conditions to which each set of the wafers is subjected are different. When it is determined that there is a need for detecting the wafers in the current batch, the operating path of all the wafers of the current batch is switched from the primary path to the secondary path. After that, according to different SWR conditions corresponding to the wafers in the current batch, all the wafers in the current batch are divided into one parent batch and several sub-batches. For example, several wafers may be extracted from one set of multiple wafers with the same SWR condition to form a sub-batch, and all the remaining wafers in the set of multiple wafers with the same SWR condition belong to the parent batch. Similarly, several wafers may be extracted from another set of multiple wafers with the same SWR condition to form another sub-batch, and all the remaining wafers in the set of multiple wafers with the same SWR condition belong to the parent batch. There is no intersection between each of the sub-batches and the parent batch, and a union of all the sub-batches and the parent batch includes all the wafers in the batch, that is, special processing conditions to which the wafers in the same sub-batch are subjected are the same, and the parent batch is composed of wafers except for the wafers forming the sub-batches in the batch. For example, as shown in FIG. 2, after the step 1 is performed on the wafers in the current batch on the primary path, it is confirmed that there is a need for detecting the wafers in the current batch, and then the operating path of the wafers in the current batch is switched to the secondary path. After that, all the wafers in the current batch are divided into one parent batch and three sub-batches (that is, the first sub-batch, the second sub-batch and the third sub-batch) according to different SWR conditions. Among them, the wafers in each of the sub-batches are processed under SWR conditions for factors such as improvement in the product quality or increase in the yield. There is no need for scanning, valuing and analyzing all the wafers in the parent batch, that is, there is no need for detecting the defects of all the wafers in the parent batch (that is, during scanning, valuing, and analyzing, all the wafers in the parent batch are skipped), and directly waiting for being merged with all sub-batches after the defect detection in all the sub-batches is finished. The defects in the first sub-batch, the second sub-batch and the third sub-batch are respectively scanned on the secondary path to acquire a first sub-batch defect scanning pattern, a second sub-batch defect scanning pattern and a third sub-batch defect scanning pattern (that is, values) in one-to-one correspondence to the first sub-batch, the second sub-batch and the third sub-batch. Then, the first sub-batch defect scanning pattern, the second sub-batch defect scanning pattern and the third sub-batch defect scanning pattern are respectively analyzed to acquire defect-related information corresponding to each SWR condition. The defect-related information includes types of defects, number of the defects, extents of the defects, and the like. All the wafers in the same batch are divided into the sub-batches and the parent batch, and the wafers in the parent batch are skipped during scanning, valuing and analyzing, such that the sampling detection is realized, the analyzing and scanning efficiency is improved, and the analyzing and scanning time is saved.

Optionally, the specific step of scanning the defects of all the wafers in each of the sub-batches includes:

setting several detecting conditions in one-to-one correspondence to special processing conditions of several sub-batches; and scanning the defects of all the wafers in each of the sub-batches according to respective detecting conditions corresponding to each of the sub-batches.

Particularly, before the defects of the wafers are detected, detecting conditions in the defect detecting process are set according to special processing conditions performed by the sub-batches, such that the defects in each of the sub-batches are pointedly scanned and detected.

Optionally, the specific step of acquiring the wafer defect scanning pattern of each of the sub-batches includes:

acquiring a plurality of wafer defect scanning patterns in one-to-one correspondence to all the wafers in one of the sub-batches; and selecting one with the largest number of defects among the plurality of wafer defect scanning patterns as the sub-batch defect scanning pattern.

Particularly, there are a plurality of wafers in each of the sub-batches. The defect of each of the wafers in the sub-batches is respectively detected, such that a wafer defect scanning pattern corresponding to each of the wafers in the sub-batch is obtained for the wafer. Although the SWR conditions to which all the wafers in the same sub-batch are subjected are the same, due to inevitable accidental errors and the like in the processing procedure, wafers in the same sub-batch have differences in the types and/or the number of the defects. In order to comprehensively analyze the defects of the wafers to avoid missing detection, in the specific embodiment, the one with the largest number of defects among the plurality of wafer defect scanning patterns is selected as the sub-batch defect scanning pattern. The number of the defects being maximal means that the types of the defects being maximal or the total number of the defects being maximal.

In step S14, it is determined whether the defect detection on the wafers is finished, and if yes, the operating path of the wafers is automatically switched to the primary path.

Optionally, no defects of the wafers in the parent batch are detected, and after confirming that the defect detection on the wafers in the sub-batches is finished, the method further includes the following steps:

re-merging the wafers in the parent batch and the wafers in the sub-batches into a batch of wafers, switching an operating path of the re-merged batch of wafers to the primary path, and performing the next processing step adjacent to the current step.

For example, as shown in FIG. 2, after confirming that the defect detection on all the wafers in each of the sub-batches is finished, the wafers in the parent batch and the wafers in the sub-batches are re-merged into a batch of wafers, and the process continues operating along the primary path, that is, the batch of re-merged wafers is controlled to start to be subjected to the step 2.

Figure 3:
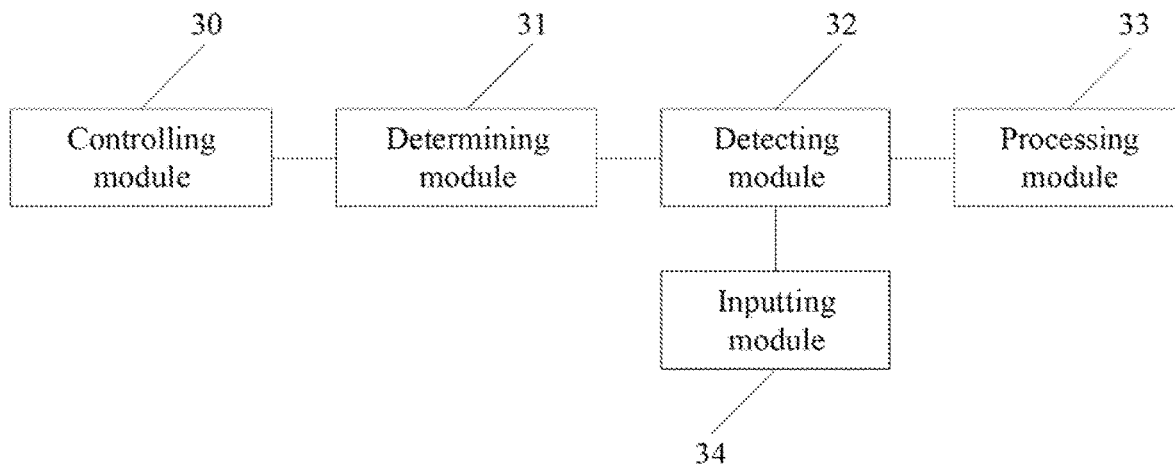
FIG. 3 is a block diagram showing a structure of an apparatus for automatically processing wafers according to a specific embodiment of the present disclosure.

Furthermore, the specific embodiment further provides an apparatus for automatically processing wafers. FIG. 3 is a block diagram showing a structure of an apparatus for automatically processing wafers according to a specific embodiment of the present disclosure. The apparatus for automatically processing wafers according to the specific embodiment includes:

a controlling module 30, which is configured to control several wafers to operate on a primary path, and the primary path is a path for forming semiconductor structures on the surfaces of the wafers;

a determining module 31, which is configured to determine whether there is a need for detecting defects of the wafers, and if yes, automatically switch an operating path of the wafers to a secondary path;

a detecting module 32, which is connected with the determining module 31 and configured to detect the defects of the wafers in the secondary path;

a processing module 33, which is connected with the detecting module 32 and configured to determine whether the defect detection on the wafers is finished or not, and if yes, automatically switch the operating path of the wafers to the primary path.

Optionally, the detecting module 32 is configured to scan the defects of the wafers, acquire a wafer defect pattern after the defects are scanned, and analyze the wafer defect pattern to acquire relevant information about the defects of the wafers.

Optionally, there are a plurality of processing steps in the primary path.

The determining module 31 is configured to determine whether there is a need for detecting defects of the wafers after the wafers are subjected to current processing steps.

Optionally, the controlling module 30 controls several wafers belonging to the same batch to operate on the primary path.

The detecting module 32 is configured to divide the wafers in the same batch into several sub-batches and one parent batch according to special processing conditions of the wafers on the primary path before the defects of the wafers are scanned, wherein each of the sub-batches includes several wafers extracted from a plurality of wafers subjected to the same special processing condition, and the parent batch is composed of wafers except for the wafers forming all the sub-batches in the same batch.

Optionally, the detecting module 32 is configured to scan the defects of all the wafers in each of the sub-batches; acquire a sub-batch defect scanning pattern of each of the sub-batches; and analyze each of the sub-batch defect patterns to acquire defect-related information of each of the sub-batches.

Optionally, the apparatus further includes:

an inputting module 34, which is configured for a user to set several detecting conditions in one-to-one correspondence to special processing conditions of several sub-batches; and the detecting module 32 is configured to scan the defects of all the wafers in each of the sub-batches according to respective detecting conditions corresponding to each of the sub-batches.

Optionally, the detecting module 32 is further configured to acquire a plurality of wafer defect scanning patterns in one-to-one correspondence to all the wafers in one of the sub-batches, and select one with the largest number of defects among the plurality of wafer defect scanning patterns as the sub-batch defect scanning pattern.

Optionally, no defects of the wafers in the parent batch are detected.

The processing module 33 is configured to re-merge the wafers in the parent batch and the wafers in the sub-batches into a batch of wafers after confirming that the defect detection on the wafers in the sub-batches is finished, and switch an operating path of the re-merged batch of wafers to the primary path, and perform the next processing step adjacent to the current step.

According to the method and the apparatus for automatically processing the wafer according to the specific embodiment, the operating path of the wafers may be automatically switched from the primary path to the secondary path; and after the wafers are detected on the secondary path, the operating path of the wafers is automatically switched from the secondary path to the primary path, such that the defects of the wafers with different SWR conditions may be automatically detected, and the automation degree of the machine is improved. Moreover, due to the fully-automated switching operation, risks and subjective errors of manual operation are reduced, and the shipping efficiency of the machine is increased accordingly. Moreover, the present disclosure may detect the defects at any step according to actual needs, which greatly reduces the impact on the product quality and lays the foundation for improving the product quality.

The above merely describes preferred embodiments of the present disclosure. It should be pointed that for those skilled in the art, some improvements and polishments, which shall also fall within the protection scope of the present disclosure, may be made without departing the principle of the present disclosure.

What is claimed is:

1. A method for automatically processing wafers, comprising:
   providing several wafers, wherein the wafers operate on a primary path, and the primary path is a path for forming semiconductor structures on the surfaces of the wafers;
   dividing the wafers in the same batch into several sub-batches and one parent batch according to special processing conditions of the wafers on the primary path, wherein each of the sub-batches comprises several wafers extracted from a plurality of wafers subjected to the same special processing condition, and the parent batch is composed of wafers except for the wafers forming all the sub-batches in the same batch;
   determining whether there is a need for detecting defects of the wafers, and if yes, automatically switching an operating path of the wafers to a secondary path;
   setting several detecting conditions in one-to-one correspondence to special processing conditions of the several sub-batches in the secondary path;
   scanning the defects of all the wafers in each of the sub-batches according to respective detecting conditions corresponding to each of the sub-batches;
   acquiring a sub-batch defect scanning pattern of each of the sub-batches;
   analyzing each of the sub-batch defect patterns to acquire defect-related information of each of the sub-batches; and
   determining whether the defect detection on the wafers is finished or not, and if yes, automatically switching the operating path of the wafers to the primary path.

2. The method for automatically processing wafers according to claim 1, wherein
   multiple processing steps exist in the primary path; and
   the specific step of determining whether there is a need for detecting defects of the wafers includes:
   after the wafers are subjected to current processing steps, determining Whether there is a need for detecting defects of the wafers.

3. The method for automatically processing wafers according to claim 1, wherein the specific step of acquiring the wafer defect scanning pattern of each of the sub-batches comprises:
   acquiring a plurality of wafer defect scanning patterns in one-to-one correspondence to all the wafers in one of the sub-batches; and
   selecting one with the largest number of defects among the plurality of wafer defect scanning patterns as the sub-batch defect scanning pattern.

4. The method for automatically processing wafers according to claim 1, wherein no detect detection on the wafers in the parent batch is performed, and after confirming that the defect detection on the wafers in the sub-batch is finished, the method further comprises the following steps:
   re-merging the wafers in the parent batch and the wafers in the sub-batches into a batch of wafers, and
   switching an operating path of the re-merged batch of wafers to the primary path, and performing the next processing step adjacent to the current step.

5. An apparatus for automatically, processing wafers, comprising:
   a controller, which is configured to control several wafers to operate on a primary path, and the primary path is a path for forming semiconductor structures on the surfaces of the wafers;
   a determining circuit, which is configured to determine whether there is a need for detecting defects of the wafers, and if yes, automatically switch an operating path of the wafers to a secondary path;
   a detector, which is connected with the determining circuit the detector is configured to divide the wafers in the same batch into several sub-batches and one parent batch according to special processing conditions of the wafers on the primary path before the defects of the wafers are scanned, wherein each of the sub-batches comprises several wafers extracted from a plurality of wafers subjected to the same special processing condition, and the parent batch is composed of wafers except for the wafers forming all the sub-batches in the same batch; and
   an input device, which is configured for a user to set several detecting conditions in one-to-one correspondence to special processing conditions of the several sub-batches;
   the detector is configured to scan the defects of all the wafers in each of the sub-batches according to respective detecting conditions corresponding to each of the sub-batches in the secondary path, and acquire a sub-batch defect scanning pattern of each of the sub-batches, and analyze each of the sub-batch defect patterns to acquire defect-related information of each of the sub-batches; and
   a processor, which is connected with the detector and configured to determine whether the detect detection on the wafers is finished or not, and if yes, automatically switch the operating path of the wafers to the primary path.

6. The apparatus for automatically processing wafers according to claim 5, wherein a plurality of processing steps exist in the primary path; and
   the determining circuit is configured to determine whether there is a need for detecting defects of the wafers after it is confirmed that the wafers are subjected to current processing steps.

7. The apparatus for automatically processing wafers according to claim 5, wherein the detector is further configured to acquire a plurality of wafer defect scanning patterns in one-to-one correspondence to all the wafers in one of the sub batches, and select one with the largest number of defects among the plurality of wafer defect scanning patterns as the sub-batch defect scanning pattern.

8. The apparatus for automatically processing wafers according to claim 5, wherein
   no defect detection is performed on the wafers in the parent batch; and
   the processor is configured to re-merge the wafers in the parent batch and the wafers in the sub-batches into a batch of wafers after confirming that the defect detection on the wafers in the sub batches is finished, and switch an operating path of the re-merged batch of wafers to the primary path, and perform the next processing step adjacent to the current step.

\* \* \* \* \*